(12) United States Patent  
Benzel et al.

(10) Patent No.: US 6,649,989 B2  
(45) Date of Patent: Nov. 18, 2003

(54) MICROMECHANICAL DIAPHRAGM

(75) Inventors: Hubert Benzel, Pliezhausen (DE); Frank Schaefer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/970,608

(22) Filed: Oct. 3, 2001

(65) Prior Publication Data

US 2003/0062579 A1 Apr. 3, 2003

Related U.S. Application Data

(62) Division of application No. 09/964,833, filed on Sep. 26, 2001.

(30) Foreign Application Priority Data

Sep. 26, 2000 (DE) .......................... 100 47 500

(51) Int. Cl.⁷ .................................................. H01L 29/06
(52) U.S. Cl. ...................... 257/419; 257/536; 148/33.2
(58) Field of Search ................ 257/419, 536; 148/33.2

(56) References Cited

U.S. PATENT DOCUMENTS

| | | | | | |
|---|---|---|---|---|---|
| 3,994,009 | A | * | 11/1976 | Hartlaub | 257/419 |
| 4,332,000 | A | * | 5/1982 | Petersen | 361/283.4 |
| 4,588,472 | A | * | 5/1986 | Shimizu | 438/53 |
| 5,296,730 | A | * | 3/1994 | Takano et al. | 257/417 |
| 5,614,753 | A | * | 3/1997 | Uchikoshi et al. | 257/417 |
| 5,949,118 | A | * | 9/1999 | Sakai et al. | 257/419 |
| 6,465,855 | B1 | * | 10/2002 | Jaussaud et al. | 257/419 |

FOREIGN PATENT DOCUMENTS

DE      43 09 207      9/1994

* cited by examiner

*Primary Examiner*—George Fourson  
(74) *Attorney, Agent, or Firm*—Kenyon & Kenyon

(57) ABSTRACT

A micromechanical diaphragm is described which has a partially n-doped p-substrate on its surface and a top n-epitaxial layer, one or more n-epitaxial layers which are p-doped in the diaphragm area being arranged on the p-substrate.

20 Claims, 2 Drawing Sheets

MICROMECHANICAL DIAPHRAGM

CROSS REFERENCE TO RELATED APPLICATION

This application claims the benefit as divisional application under 35 U.S.C. §120 of U.S. application Ser. No. 09/964,833, filed Sep. 26, 2001, which is incorporated herein by reference.

FIELD OF THE INVENTION

The present invention relates to a micromechanical diaphragm having a partially n-doped p-substrate on its surface, a topmost layer being an n-epitaxial layer.

BACKGROUND INFORMATION

In micromechanical pressure sensors, a diaphragm is defined by anisotropic etching with a pn-etch stop. The etch front stops at the boundary surface between the p-doped substrate and an n-doped layer. The clamping of the diaphragm is defined by the edge of the etched pit. The pressure-dependent deflection of the diaphragm is measured via the change in resistance of piezoresistive resistors on the surface of the diaphragm. Of critical importance for the sensitivity of the resistors is the position of the resistors relative to the clamping of the diaphragm.

A micromechanical diaphragm is already known from German Published Patent Application No. 43 09 207. This publication describes a semiconductor device with a piezoresistive pressure sensor having a diaphragm formed by a conductive epitaxial layer (epitaxy layer) and applied to a semiconductor substrate of opposite conductivity. At least one piezoresistor is provided on the diaphragm surface facing away from the semiconductor and an opening penetrating the semiconductor substrate has been etched into the inner surface of the diaphragm. A conductive intermediate layer having an annular structure has been inserted between the semiconductor substrate and the epitaxial layer, the intermediate layer defining the area of the opening adjacent to the inner surface of the diaphragm. The intermediate layer possesses a conductivity which is opposite to that of the semiconductor substrate. This diaphragm with varying dopings ensures that there are only limited differences in thickness in the diaphragm which are determined by the penetration depth of the doping. In addition, the diaphragm described here has only one epitaxial layer.

SUMMARY OF THE INVENTION

An object of the present invention is to design and arrange a micromechanical diaphragm in such a way that precisely formed clampings or diaphragm areas with strongly varying stiffness are ensured.

This object is achieved according to the present invention in that one or more n-epitaxial layers which are p-doped in the diaphragm area are arranged on the p-substrate. This ensures that the clamping or support points of the diaphragm are defined during the subsequent etching of the diaphragm, i.e. the p-doped area, and not by the underetching of the lateral surfaces. The edge area of the etching within the p-doped substrate is located below the additionally arranged n-epitaxial layers and does not influence the behavior or the clamping of the diaphragm. A precise definition of the clamping of the diaphragm is, for example, very important for pressure sensors since the position of the piezoresistive resistors relative to the clamping (diaphragm edge) influences the sensitivity with respect to pressure.

It is advantageous in this regard that the substrate is locally n-doped before the n-epitaxial layer is deposited and that the n-epitaxial layer is n-doped during the deposition and is then locally p-doped or p-doped during the deposition and then locally n-doped in the edge area or the epitaxial layer is deposited undoped and subsequently the edge area is provided locally with an n-doping and the center area of the epitaxial layer is provided with a p-doping. This type of doping makes continuous doping possible so that the individual n-epitaxial layers are thicker. The variable number of n-epitaxial layers presented here also permits clearly greater thicknesses of the clamping of the diaphragm.

According to a further development, an additional possibility is that an n-doped diaphragm layer or the diaphragm is in contact with the locally p-doped n-epitaxial layer or the locally n-doped p-substrate. The diaphragm thus formed or stiffening of the diaphragm is substantially thicker in the clamping area and accordingly significantly more stabile.

In addition, it is advantageous that the p-doped area of the various n-epitaxial layers or of the locally n-doped p-substrate is formed with a varying size in the individual n-epitaxial layers or in the doping layer or extending from the diaphragm layer or a diaphragm, it has a larger or smaller surface area than in the preceding layer. It is thus possible to design any desired stiffening form below the diaphragm and the diaphragm can be adapted corresponding to its field of application.

It is also advantageous in this regard that the p-doped area of the various n-epitaxial layers or of the locally n-doped p-substrate is arranged in various subareas of the respective layer, such as the center of the micromechanical diaphragm or below the diaphragm and the n-doped areas and the p-doped areas, always in alternation with an n-epitaxial layer, are arranged side by side and/or symmetric to the center of the micromechanical diaphragm.

According to a preferred embodiment of the device according to the present invention, it is also provided that the various n-epitaxial layers are formed with varying thicknesses.

It is of particular significance for the present invention that the areas previously identified as n-doped may also be p-doped and the areas previously identified as p-doped may also be n-doped. Accordingly, the base doping of the various layers may be selected freely and the corresponding locally provided doping may be adapted.

Finally, it is of advantage that the diaphragm layer is formed as an n-epitaxial layer and the side of the p-substrate directed to the outside has an etch mask which opens up the area to be exposed below the diaphragm to the etching agent.

Lastly, it is of advantage that one side of a p-substrate is locally n-doped in the edge area; an n-epitaxial layer is deposited on or applied to this layer, the center of the n-epitaxial layer being p-doped corresponding to the preceding substrate layer, and a second n-epitaxial layer is applied corresponding to the first n-epitaxial layer, the second n-epitaxial layer being p-doped in the diaphragm area or in additional areas. After that, a purely n-doped diaphragm layer is deposited on or applied to the n-epitaxial layer, an etch mask being applied to the exposed surface of the substrate.

DETAILED DESCRIPTION

A micromechanical diaphragm 9 is produced by applying various differently doped epitaxial layers 1, 7, 7' to a substrate 3.

Figure 1:
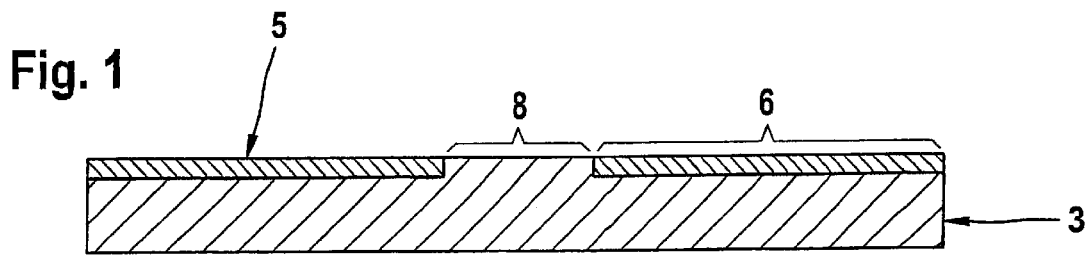
FIG. 1 shows a procedural step for the production of a micromechanical diaphragm having a p-substrate and locally p-doped n-epitaxial layers in the edge area.

The p-doped substrate which forms the basis for the production of the micromechanical diaphragm is identified by 3 in FIG. 1. Surface 5 of substrate 3 is locally n-doped, i.e., in addition to its general p-doping, it has an n-doped area 6 on its surface 5. n-doped area 6 extends to the edge area of surface 5 of a chip so that a central p-doped area 8 is preserved on surface 5. In this connection, doped layer 6 attains a thickness or height of 3–10 μm.

Figure 2:
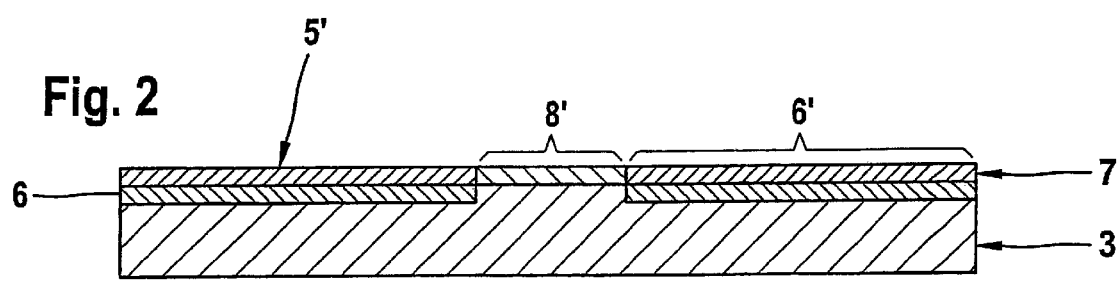
FIG. 2 shows another procedural step for the production of a micromechanical diaphragm having a p-substrate and locally p-doped n-epitaxial layers in the edge area.

According to a further method step in FIG. 2, a locally p-doped n-epitaxial layer 7 is applied to substrate 3, i.e. to its locally n-doped surface 5 (see FIG. 1). Corresponding to n-doped area 6 of substrate 3, edge area 6' of the n-epitaxial layer also continues to be n-doped. n-epitaxial layer 7 is either n-doped during the deposition and subsequently locally p-doped or p-doped during the deposition and subsequently locally n-doped in edge area 6'. It is also possible to deposit the epitaxial layer undoped and subsequently to provide edge area 6' locally with an n-doping and area 8' with a p-doping. Lastly, an n-doped edge area 6' arises as well as a p-doped area 8' in the center of n-epitaxial layer 7.

Figure 3:
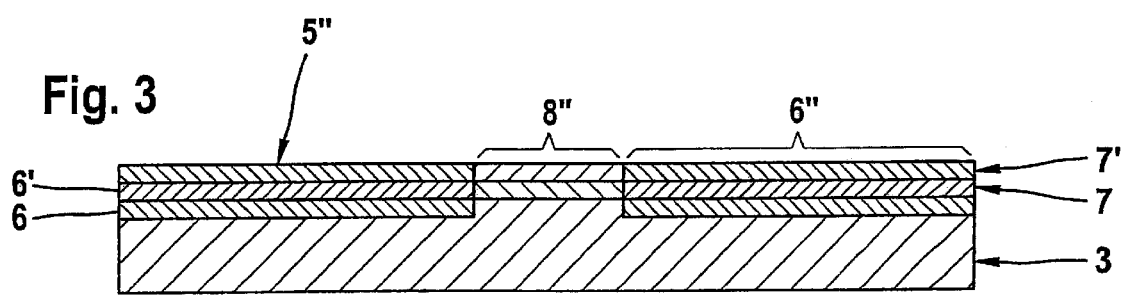
FIG. 3 shows another procedural step for the production of a micromechanical diaphragm having a p-substrate and locally p-doped n-epitaxial layers in the edge area.

According to a further method step in FIG. 3, a second n-epitaxial layer 7' is deposited on or applied to a surface 5' (see FIG. 2), the central area of the n-epitaxial layer, corresponding to first n-epitaxial layer 7, is also locally p-doped, i.e. has an outer n-doped area 6" and an inner p-doped area 8". These differently doped areas are formed according to the diaphragm shape provided later.

Figure 4:
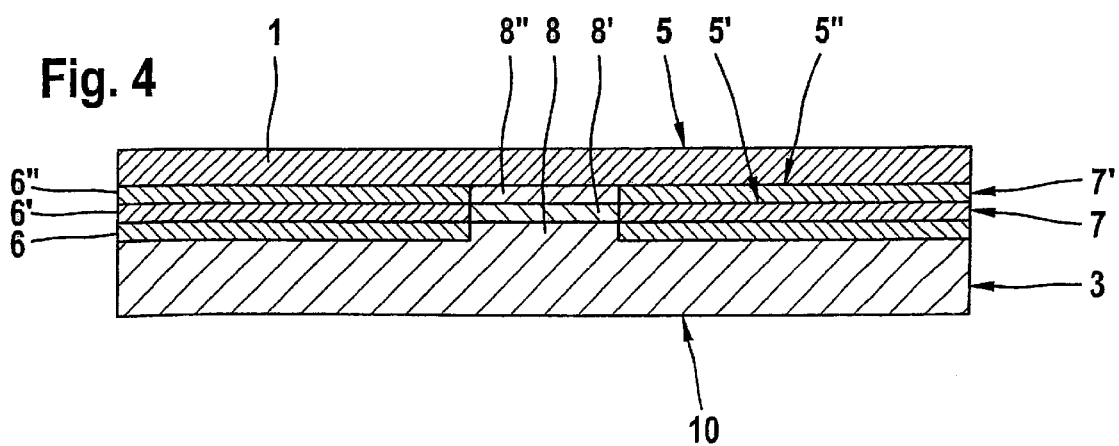
FIG. 4 shows another procedural step for the production of a micromechanical diaphragm having a p-substrate and locally p-doped n-epitaxial layers in the edge area.

According to FIG. 4, an n-doped diaphragm layer 1 is applied to or placed on a surface 5" (see FIG. 3) of second n-epitaxial layer 7' in the next method step.

The micromechanical diaphragm (FIG. 4) formed in this manner thus has the essentially purely p-doped substrate 3 and the purely n-doped diaphragm layer 1 which accommodate two n-epitaxial layers 7, 7' between them. In this connection, the doping of n-epitaxial layers 7, 7' and surface 5 of substrate 3 varies locally, i.e., n-doped and p-doped areas alternate in the respective layer 7, 7', the p-doped areas being provided in the center. Depending on the embodiment, it is also possible to provide the p-doped areas off-center.

Figure 5:
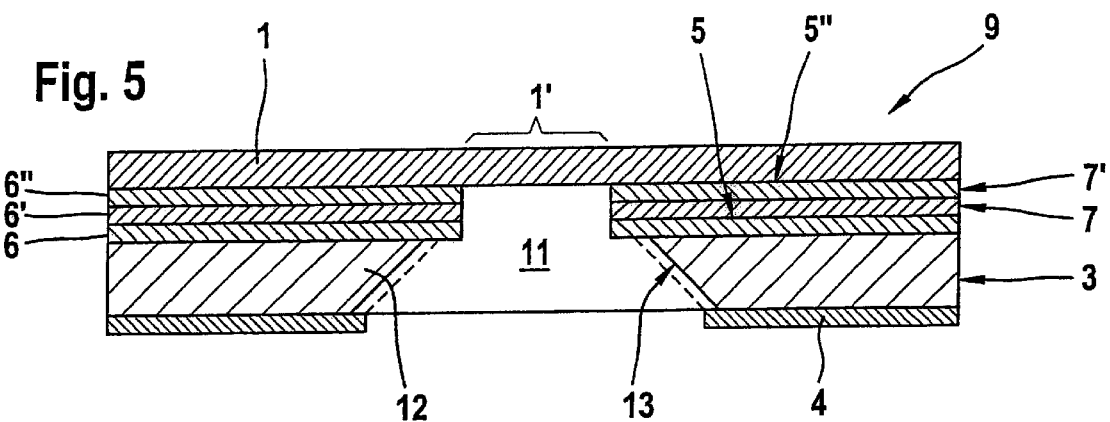
FIG. 5 shows another procedural step for the production of a micromechanical diaphragm having a p-substrate and locally p-doped n-epitaxial layers in the edge area.

According to FIG. 5, an etch mask 4 is provided on a remaining outer surface 10 of substrate 3. Etch mask 4 covers the edge areas of substrate 3 so that a central area remains open. The etching or the etch front starts at this open surface and is stopped by a pn-etch stop, i.e., the boundary of the etching is defined by the n-doped areas. Accordingly, only the central p-doped area is attacked, i.e. etched open by the etching and n-doped edge area 6, 6', 6" is preserved.

Consequently, the previously p-doped area, i.e. substrate 3 where the etch mask provides access for the etching agent, is removed. Only a flank 13 of a still preserved p-doped subarea 12 is attacked by the etching agent in the trapezoidal open space 11 formed so that this flank is propagated toward the edge area in proportion to the etching time. The area formed by the etching boundary within the p-doped area is suggested by a dashed line since this boundary cannot be precisely defined due to the underetching.

As a result of open space 11 formed in the central area, diaphragm layer 1 forms an exposed diaphragm 1' in this area. Diaphragm 1' essentially has the size of the previous p-doped areas 8, 8', 8" of n-epitaxial layers 7, 7' since these were removed in the etching and thus the formation of diaphragm 1' was made possible.

Figure 6:
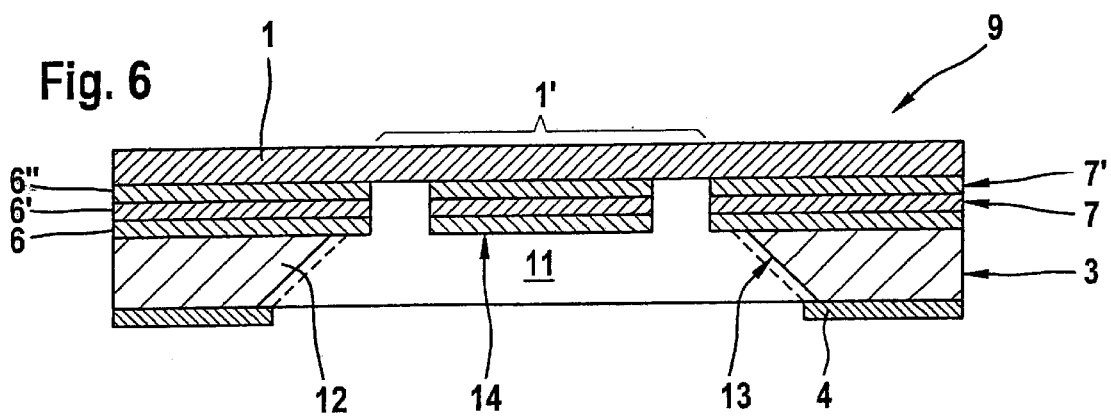
FIG. 6 shows a second exemplary embodiment according to FIG. 5 with a diaphragm of varying stiffening.
Figure 7:
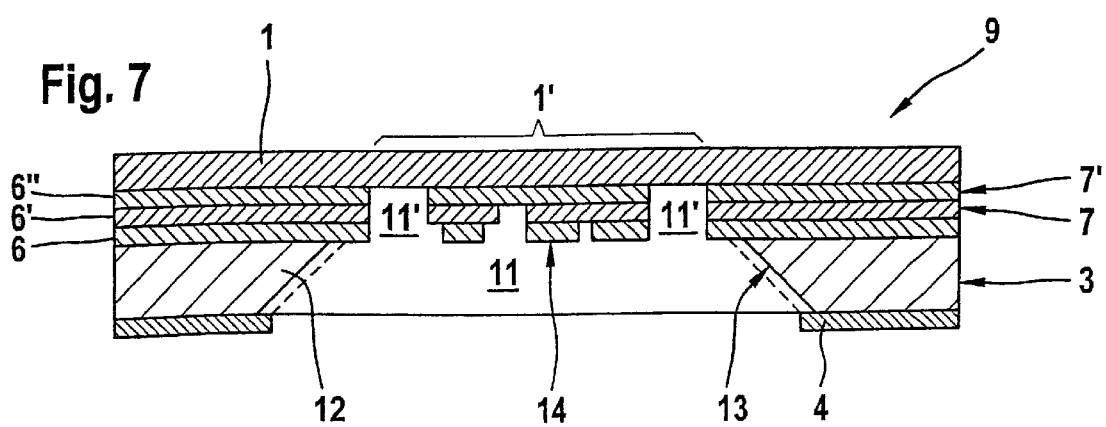
FIG. 7 shows a third exemplary embodiment according to FIG. 5 with an additional stiffening modification.

Two modifications of the embodiment of p-doped areas 8, 8', 8", i.e. diaphragm 1' formed from them, are shown in FIGS. 6 and 7.

The extension of open space 11 to the edge area is formed here essentially larger than in FIG. 5, i.e, the freely oscillating area of diaphragm layer 1, i.e., diaphragm 1', is formed essentially wider according to FIGS. 6 and 7. In the central area of diaphragm 1', in contact with diaphragm layer 1, n-doped areas 6, 6', 6" are provided which serve as stiffening 14 of diaphragm 1'. These areas were formed during production as n-doped areas 6, 6', 6" in the respective n-epitaxial layer.

According to FIG. 7, stiffening 14 may have any desired shape so that any desired open spaces 11 corresponding to the previously p-doped areas are formed within stiffening 14.

The cross-section of open space 11 shown here, i.e. its subareas 11', is rectangular in the ideal case, open space 11, i.e. its projection surface perpendicular to surface 5, becoming smaller starting from etch mask 4 toward diaphragm 1' or gradually thinning to the size of diaphragm 1'.

What is claimed is:

1. A micromechanical diaphragm, comprising:
   a partially n-doped p-substrate including a surface;
   a topmost layer including an n-epitaxial layer being arranged on the partially n-doped p-substrate; and
   at least one other n-epitaxial layer that is p-doped in a diaphragm area and is arranged on the partially n-doped p-substrate.

2. The diaphragm according to claim 1, wherein:
   the at least one other n-epitaxial layer is one of n-doped during a deposition and then locally p-doped, p-doped during the deposition and then locally n-doped in an edge area, and deposited undoped and locally n-doped in the edge area and locally p-doped in the diaphragm area.

3. The diaphragm according to claim 1, wherein:
   one of the n-epitaxial layer and the diaphragm area is in contact with the at least one other n-epitaxial layer.

4. The diaphragm according to claim 1, wherein:
   a p-doped area of one of the at least one other n-epitaxial layer and of the partially n-doped p-substrate is formed with a varying size in individual layers of the at least one other n-epitaxial layer.

5. The diaphragm according to claim 1, wherein:
   a p-doped area of one of the at least one other n-epitaxial layer and of the partially n-doped p-substrate is formed by layers to have a larger surface area extending from one of the n-epitaxial layer and the diaphragm area than in a preceding layer.

6. The diaphragm according to claim 1, wherein:
a p-doped area of one of the at least one other n-epitaxial layer and of the partially n-doped p-substrate is formed by layers to have a smaller surface area extending from one of the n-epitaxial layer and the diaphragm area than in a preceding layer.

7. The diaphragm according to claim 1, wherein:
a p-doped area of one of the at least one other n-epitaxial layer and of the partially n-doped p-substrate is arranged in various subareas of a respective layer corresponding to one of a center of the micromechanical diaphragm and below the n-epitaxial layer.

8. The diaphragm according to clam 1, wherein:
n-doped areas and p-doped areas, always in alternation with the at least one other n-epitaxial layer, are arranged at least one of side by side and symmetric to a center of the micromechanical diaphragm.

9. The diaphragm according to claim 1, wherein:
the at least one other n-epitaxial layer and the n-epitaxial layer are formed with varying thicknesses.

10. The diaphragm according to claim 1, wherein:
a side of the partially n-doped p-substrate directed to an outside has an etch mask.

11. A micromechanical diaphragm, comprising:
a p-type substrate having a surface;
n-type regions on the surface of the substrate;
a topmost layer including an n-type epitaxial layer over the surface; and
at least one other n-type epitaxial layer having a p-type region in a diaphragm area over the surface.

12. The diaphragm according to claim 11, wherein the at least one other n-type epitaxial layer is one of n-doped during a deposition and then locally p-doped, p-doped during the deposition and then locally n-doped in an edge area, and deposited and locally n-doped in the edge area and locally p-doped in the diaphragm area.

13. The diaphragm according to claim 11, wherein one of the n-type epitaxial layer and the diaphragm area is in contact with the at least one other n-type epitaxial layer.

14. The diaphragm according to claim 11, wherein a p-doped area of one of the at least one other n-type epitaxial layer and of the n-type regions is formed with a varying size in individual layers of the at least one other n-type epitaxial layer.

15. The diaphragm according to claim 11, wherein a p-doped area of one of the at least one other n-type epitaxial layer and of the n-type regions is formed by layers to have a larger surface area extending from one of the n-type epitaxial layer and the diaphragm area than in a preceding layer.

16. The diaphragm according to claim 11, wherein a p-doped area of one of the at least one other n-type epitaxial layer and of the n-type regions is formed by layers to have a smaller surface area extending from one of the n-type epitaxial layer and the diaphragm area than in a preceding layer.

17. The diaphragm according to claim 11, wherein a p-doped area of one of the at least one other n-type epitaxial layer and of the n-type regions is arranged in various subareas of a respective layer corresponding to one of a center of the micromechanical diaphragm and below the n-type epitaxial layer.

18. The diaphragm according to claim 11, wherein n-doped areas and p-doped areas, always in alternation with the at least one other n-type epitaxial layer, are arranged at least one of side by side and symmetric to a center of the micromechanical diaphragm.

19. The diaphragm according to claim 11, wherein the at least one other n-type epitaxial layer and the n-type epitaxial layer are formed with varying thicknesses.

20. The diaphragm according to claim 11, wherein a side of the n-type regions directed to an outside has an etch mask.

* * * * *